United States Patent
Kurahashi et al.

(10) Patent No.: US 11,148,452 B2
(45) Date of Patent: Oct. 19, 2021

(54) SCREEN PLATE AND METHOD FOR MANUFACTURING SAME

(71) Applicant: NBC MESHTEC INC., Tokyo (JP)

(72) Inventors: Shinji Kurahashi, Tokyo (JP); Hiroki Sano, Tokyo (JP); Nobukazu Motojima, Tokyo (JP); Tsuruo Nakayama, Tokyo (JP)

(73) Assignee: NBC MESHTEC INC., Tokyo (JP)

( * ) Notice: Subject to any disclaimer, the term of this patent is extended or adjusted under 35 U.S.C. 154(b) by 243 days.

(21) Appl. No.: 16/465,216

(22) PCT Filed: Dec. 6, 2017

(86) PCT No.: PCT/JP2017/043824
§ 371 (c)(1),
(2) Date: May 30, 2019

(87) PCT Pub. No.: WO2018/105657
PCT Pub. Date: Jun. 14, 2018

(65) Prior Publication Data
US 2020/0001642 A1    Jan. 2, 2020

(30) Foreign Application Priority Data

Dec. 6, 2016 (JP) .............................. JP2016-236945

(51) Int. Cl.
*B41N 1/24* (2006.01)
*B41F 15/36* (2006.01)

(52) U.S. Cl.
CPC .............. *B41N 1/247* (2013.01); *B41F 15/36* (2013.01)

(58) Field of Classification Search
CPC ...... B41F 15/36; B41N 1/247; B41P 2215/12; H05K 3/1225
See application file for complete search history.

(56) References Cited

U.S. PATENT DOCUMENTS 4,959,260 A * 9/1990 Tomoyasu ............... D03D 9/00
442/4
5,365,840 A * 11/1994 Newman .................. B41C 1/14
101/127

(Continued)

FOREIGN PATENT DOCUMENTS

EP    0 439 960    8/1991
JP    59-115850    7/1984

(Continued)

OTHER PUBLICATIONS

Extended European Search Report dated Jun. 9, 2020 in corresponding European Patent Application No. 17877632.4.

(Continued)

*Primary Examiner* — Matthew G Marini
*Assistant Examiner* — Marissa Ferguson-Samreth
(74) *Attorney, Agent, or Firm* — Wenderoth, Lind & Ponack, L.L.P.

(57) ABSTRACT

To provide a screen plate that can allow printing accuracy to be improved. A screen plate comprising a plate frame and a screen gauze formed of warp and weft fibers each made of a synthetic fiber, wherein the screen gauze is stretched on the plate frame under application of a predetermined tensile force, and the thickness of the screen gauze stretched on the plate frame is 88% or less based on the thickness of the screen gauze under application of no tensile force.

4 Claims, 4 Drawing Sheets

(56) References Cited

U.S. PATENT DOCUMENTS

| | | | | |
|---|---|---|---|---|
| 5,473,981 A * | 12/1995 | Mazaki | ................... | B41F 15/36 |
| | | | | 101/128.21 |
| 6,244,173 B1 | 6/2001 | Tomikawa et al. | | |
| 6,582,504 B1 | 6/2003 | Fujita | | |
| 9,333,740 B2 * | 5/2016 | Brocker | ................. | B41N 1/247 |
| 2015/0314588 A1 * | 11/2015 | Chousa | ................... | C23C 18/50 |
| | | | | 428/212 |
| 2016/0129685 A1 * | 5/2016 | Usui | ...................... | B41N 1/247 |
| | | | | 101/127 |
| 2020/0399821 A1 * | 12/2020 | Yoshioka | ............. | B07B 1/4672 |

FOREIGN PATENT DOCUMENTS

| | | | | |
|---|---|---|---|---|
| JP | 2008074073 | * | 9/2006 | ............. B41N 1/247 |
| JP | 2008-74073 | | 4/2008 | |
| JP | 2013-233721 | | 11/2013 | |
| WO | 2016/166916 | | 10/2016 | |

OTHER PUBLICATIONS

International Preliminary Report on Patentability dated Jun. 20, 2019 in International Application No. PCT/JP2017/043824.
International Search Report dated Jan. 23, 2018 in International Application No. PCT/JP2017/043824.

* cited by examiner

ULTRAVIOLET LIGHT

SCREEN PLATE AND METHOD FOR MANUFACTURING SAME

TECHNICAL FIELD

The present invention relates to a screen plate, and particularly relates to a screen plate that can allow printing accuracy to be improved.

BACKGROUND ART

Screen printing is widely used in industry as a printing technique which can be larger in size without requiring any expensive facilities, and which can form a printing coating film having a thickness of about 1 μm to several tens micrometers by one printing. Screen printing is applied to various fields, for example, character printing on signboards and industrial components, formation of electrodes for electronic components including printed boards, and solar batteries, dielectric printing on plasma displays, thick film printing, thick film patterning, and hole plugging printing.

Screen plates for use in screen printing include woven products of synthetic fibers, woven products of metallic fibers, and metallic plates on which pores are formed by etching. In particular, synthetic fiber screens are most widely used because such screens are inexpensive and easily handled. Materials for synthetic fibers are monofilaments of general-purpose fibers such as polyester and nylon, and generally have a diameter of about 27 μm to 60 μm. Metallic fiber screens widely used are woven products of stainless fibers having a diameter of 16 μm to 30 μm.

Screen printing is widely used as a procedure for formation of a printing coating film being a thick film having a thickness of about 1 μm to several tens micrometers, as described above, and has the advantages of not requiring any large-sized vacuum facilities, being simple, and being capable of suppressing an increase in cost. Thus, screen printing is attempted to be used as not only a procedure for forming a thick film, but also a procedure for forming a thin film having a thickness of 1 μm or less. A thin printing coating film obtained can be used for, for example, an emitting layer of an organic EL element.

Conventional studies have provided methods for providing a thin printing coating film according to screen printing, and there have been used a method for providing a thin printing coating film due to a decrease in the concentration of a solid contained in ink, by use of a screen plate obtained by weaving with a monofilament of nylon or polyester as a general-purpose synthetic fiber (Patent Literature 1), and a method for providing a thin printing coating film due to a decrease in the thickness of a screen by flattening of fibers constituting a screen according to pressurizing or the like (Patent Literature 2).

CITATION LIST

Patent Literature

Patent Literature 1: Japanese Patent Laid-Open No. 2001-155858
Patent Literature 2: Japanese Patent Laid-Open No. 2008-74073

SUMMARY OF INVENTION

Technical Problem

The method for providing a thin printing coating film due to a decrease in the concentration of a solid contained in ink, as described in Patent Literature 1, however, causes a large variation in the thickness of the film due to a slight change in the concentration of a solid in ink. In addition, a problem is that a low concentration of the solid causes a low viscosity of ink, easily resulting in the occurrence of a phenomenon called jaggy where an end of a printing coating film is blurred and/or an end (namely, a boundary section with a substrate) of a printing coating film is irregularly protruded, thereby making formation of a fine printing pattern difficult.

The method disclosed in Patent Literature 2, where the fibers constituting a screen are flattened to thereby decrease the thickness of a screen gauze, causes the width (size in a plane surface perpendicular to the thickness direction of the screen) of each fiber constituting the screen gauze to be more than the width of the fiber before pressurizing, resulting in a reduction in the rate of area of opening portions in the screen gauze. The opening portions each correspond to a portion to be filled with ink serving as a raw material of a printing coating film, and such ink filling the opening portions is transferred to a substrate, thereby providing the printing coating film. Thus, a reduction in the rate of area of the opening portions causes a reduction in the amount of ink to be transferred to the substrate, causing ink to be hardly spread uniformly on the substrate. Accordingly, the method disclosed in Patent Literature 2 has the problem of not providing any printing coating film having a uniform thickness.

The present invention has been made in order to solve such problems, and an object thereof is to provide a screen plate that can allow printing accuracy to be improved and a method for manufacturing the screen plate.

Solution to Problem

The summary of the present invention is as follows.

[1] A screen plate comprising
  a plate frame, and
  a screen gauze formed of warp and weft fibers each made of a synthetic fiber, wherein
  the screen gauze is stretched on the plate frame under application of a predetermined tensile force, and
  a thickness of the screen gauze stretched on the plate frame is 88% or less based on a thickness of the screen gauze under application of no tensile force.
[2] The screen plate according to [1], wherein the thickness of the screen gauze stretched on the plate frame is 70% or more based on the thickness of the screen gauze under application of no tensile force.
[3] The screen plate according to [1] or [2], wherein the synthetic fiber comprises a liquid crystal polymer.
[4] The screen plate according to any one of [1] to [3], wherein the warp and weft fibers are monofilaments.
[5] A method for manufacturing a screen plate, comprising
  applying a predetermined tensile force to a screen gauze formed of warp and weft fibers each made of a synthetic fiber, to stretch the screen gauze on a plate frame, and
  allowing a thickness of the screen gauze stretched on the plate frame to be 88% or less based on a thickness of the screen gauze under application of no tensile force.
[6] The method for manufacturing a screen plate according to [5], wherein the predetermined tensile force is 21 N/cm to 36 N/cm.

Advantageous Effects of Invention

The present invention can provide a screen plate that can allow printing accuracy to be improved.

DESCRIPTION OF EMBODIMENTS

Hereinafter, an embodiment of the present invention will be described. Herein, a Z-axis and a Y-axis are axes perpendicular to each other and an axis perpendicular to both the Z-axis and the Y-axis is defined as an X-axis in FIG. 1, FIG. 2 and FIG. 4 to FIG. 8. In the present embodiment, the Z-axis direction is defined as the thickness direction of a screen plate 1 and a screen gauze 3.

Figure 1:
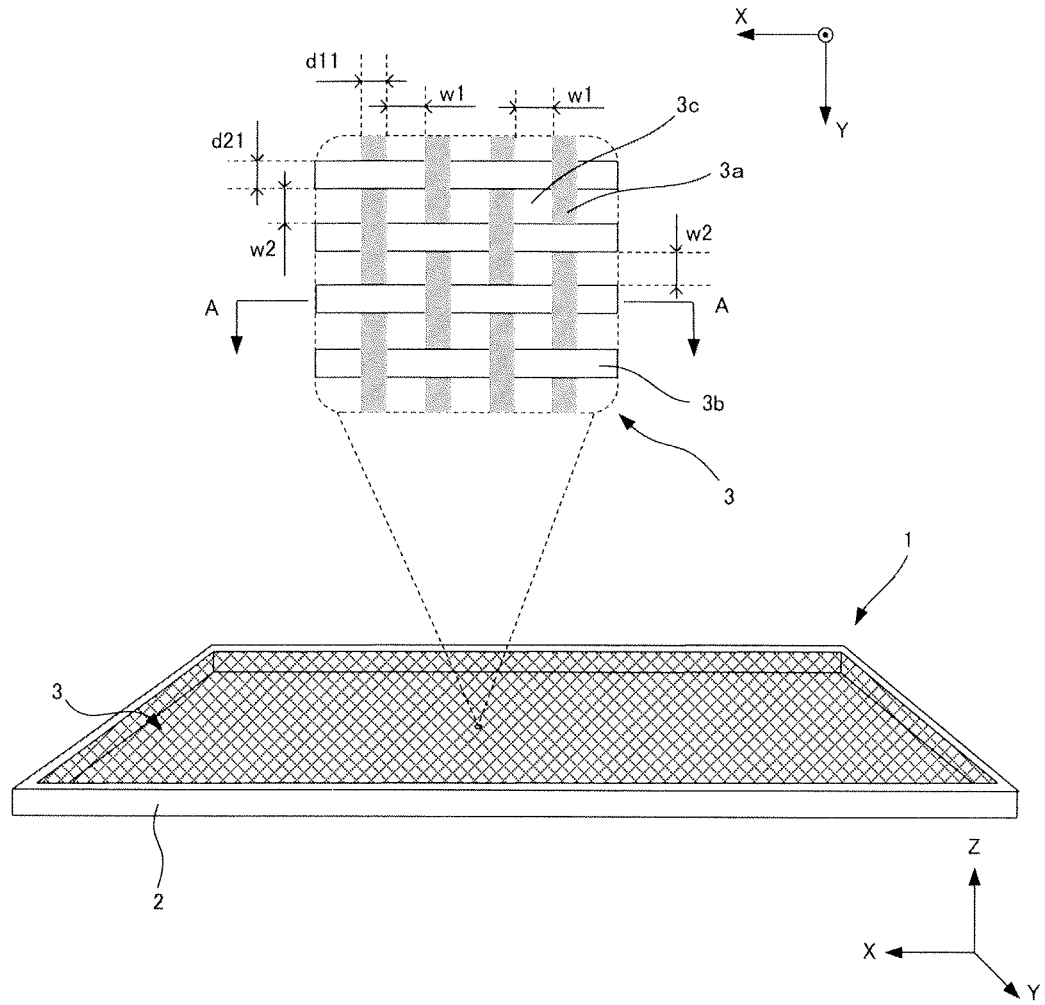
FIG. 1 is a schematic view illustrating a screen plate.

A screen plate 1 of the present embodiment is a printing plate for use in screen printing, and comprises a plate frame 2 and a screen gauze 3 stretched on the plate frame 2, as illustrated in FIG. 1.

The plate frame 2 is a rectangular frame, and is a member for retaining the screen gauze 3. The material of the plate frame 2 is not particularly limited and, for example, a metal, a cast metal, a resin, or a wood material can be used.

The screen gauze 3 is a woven fabric that is to be filled with ink to transfer the ink after the filling to a substrate. The screen gauze 3, the periphery of which is secured to the plate frame 2, is thus retained on the plate frame 2 with being pulled to the plate frame 2, as illustrated in FIG. 1. In other words, the screen gauze 3 is stretched on the plate frame 2 under application of a predetermined tensile force in an X-axis direction and a Y-axis direction. The ink that can be here used is not limited to any paint for coloration and color development, and can be any raw material for electronic components, for the purpose of formation of electronic components such as an electrode and a dielectric. The ink can be, for example, in the form of a liquid or paste.

The screen gauze 3 includes a plurality of warp fibers 3a and a plurality of weft fibers 3b, as illustrated in a partially enlarged view of FIG. 1. The warp fibers 3a and the weft fibers 3b are alternately located on and below in the Z-axis direction and woven thereby constituting a plain weave. The weaving texture of the screen gauze 3 in the screen plate 1 of the present embodiment is not particularly limited and can also be a twill weave or sateen weave. The weaving texture of the screen gauze 3, however, is preferably a plain weave from the viewpoint that the thickness of the screen gauze 3 in the Z-axis direction is reduced and slippage is unlikely to be caused.

The plurality of warp fibers 3a are placed in parallel on the X-Y plane surface at a predetermined interval w1. The plurality of weft fibers 3b are placed perpendicularly to the warp fibers 3a on the X-Y plane surface, and are placed in parallel at a predetermined interval w2. Opening portions 3c are formed in spaces surrounded by the warp fibers 3a and the weft fibers 3b, and are to be filled with ink described below. The interval w1 and the interval w2 are the same as each other in the screen plate 1 of the present embodiment. The interval w1 and the interval w2, however, may be different from each other.

Figure 2:
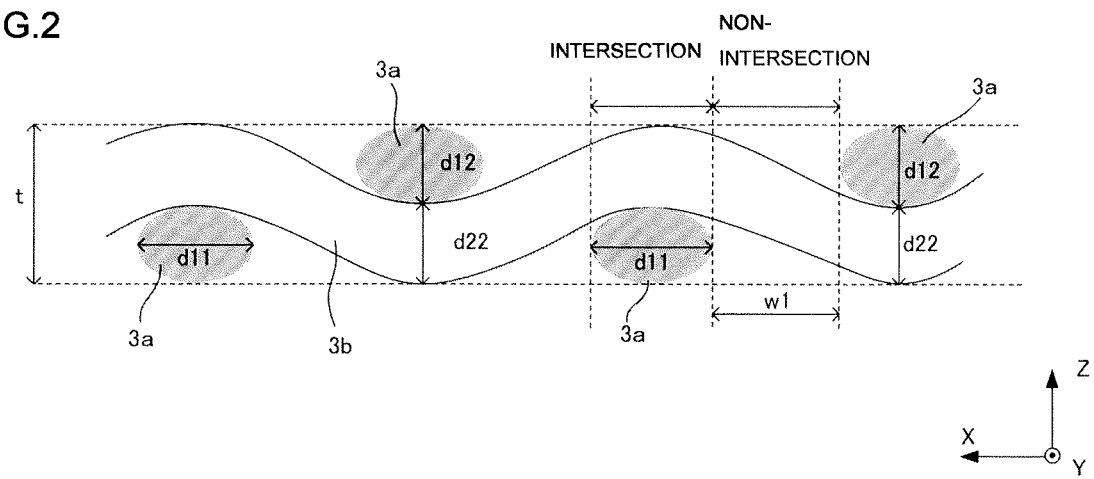
FIG. 2 is a partial cross-sectional view of a screen gauze.

FIG. 2 is a cross-sectional view of the screen gauze 3 illustrated in FIG. 1, along with an A-A line. As illustrated in FIG. 2, the cross sections of the warp fibers 3a each have an ellipsoidal shape having a longer diameter d11 in the X-axis direction and a shorter diameter d12 in the Z-axis direction. The cross sections of the weft fibers 3b similarly each have an ellipsoidal shape having a longer diameter d21 in the Y-axis direction (see FIG. 1) and a shorter diameter d22 in the Z-axis direction. In the screen plate 1 of the present embodiment, the longer diameter d11 (hereinafter, also referred to as "width d11") of each of the warp fibers 3a is the same as the longer diameter d21 (hereinafter, also referred to as "width d21") of each of the weft fibers 3b, and the shorter diameter d12 (hereinafter, also referred to as "thickness d12") of each of the warp fibers 3a is the same as the shorter diameter d22 (hereinafter, also referred to as "thickness d22") of each of the weft fibers 3b. The cross sectional shape of each of the warp fibers 3a and that of each of the weft fibers 3b before weaving are preferably circular shapes having the same diameter as each other from the viewpoints that the screen gauze 3 is easily obtained with weaving and the variation in strength (for example, tensile strength) between the warp fibers 3a and the weft fibers 3b in the screen gauze 3 can be suppressed. Herein, the widths (d11, d21) of each of the warp fiber 3a and each of the weft fiber 3b may be different from each other, and the thicknesses (d12, d22) of each of the warp fiber 3a and each of the weft fiber 3b may be different from each other.

The screen gauze 3 has crossing-portions where each of the warp fibers 3a and each of the weft fibers 3b are overlapped in the Z-axis direction, and each non crossing-portions where each of the warp fibers 3a and each of the weft fibers 3b are not overlapped in the Z-axis direction. The thickness t of the screen gauze 3 corresponds to the thickness at such a crossing-portion where each of the warp fibers 3a and each of the weft fibers 3b are overlapped, and corresponds to the total of the thickness d12 of each of the warp fibers 3a and the thickness d22 of each of the weft fibers 3b. It is effective for formation of a thin printing coating film having a thickness of 1 μm or less that the thickness t of the screen gauze 3 be decreased, and it is effective for a decrease in the thickness t of the screen gauze 3 that any warp fiber 3a and any weft fiber 3b each having a small thickness be used.

The warp fibers 3a and the weft fibers 3b are each made of a synthetic fiber, and can be elongated by application of a tensile force in the longitudinal direction and thus reduced in the thicknesses (d12, d22). The warp fibers 3a and the weft fibers 3b are under application of a tensile force in the longitudinal direction in the screen gauze 3 stretched on the plate frame 2, and thus the warp fibers 3a and the weft fibers 3b are elongated. The total thickness (d12+d22) of each of the warp fibers 3a and each of the weft fibers 3b is decreased to 88% or less based on the total thickness of each of the warp fibers 3a and each of the weft fibers 3b under application of no tensile force. In other words, the thickness t of the screen gauze 3 stretched on the plate frame 2 is decreased to 88% or less based on the thickness of the screen gauze 3 under application of no tensile force. The thickness t of the screen gauze 3 is preferably 70% or more and 88% or less based on the thickness of the screen gauze 3 under application of no tensile force, and the thickness t of the screen gauze 3 is more preferably 75% or more and 86% or less based on the thickness of the screen gauze 3 under application of no tensile force. Herein, the longitudinal direction of the warp fibers 3a corresponds to the Y-axis direction, and the longitudinal direction of the weft fibers 3b corresponds to the X-axis direction. The warp fibers 3a and the weft fibers 3b may be elongated by plastic deformation or elastic deformation, and is preferably elongated by elastic deformation. The warp fibers 3a and the weft fibers 3b, which are elongated by elastic deformation, are easily returned to the original state before the warp fibers 3a and the weft fibers 3b are subjected to screen printing, even in deformation (elongation) of the warp fibers 3a and the weft fibers 3b due to repeated screen printing. Thus, an improved printing accuracy is easily kept even in repeated screen printing. On the other hand, the warp fibers 3a and the weft fibers 3b, which are elongated by plastic deformation, are easily kept with being deformed (elongated) by deformation (elongation) of the warp fibers 3a and the weft fibers 3b due to repeated screen printing. Thus, an improved printing accuracy is hardly kept in repeated screen printing. Herein, the elastic deformation refers to any deformation that allows the original length to be recovered after application of an external force to the warp fibers 3a and the weft fibers 3b for elongation of these fibers and then removal of the external force, and the plastic deformation refers to any deformation that causes elongation to remain after application of an external force to the warp fibers 3a and the weft fibers 3b for elongation of these fibers and then removal of the external force.

The warp fibers 3a and the weft fibers 3b each made of a synthetic fiber, even in the case of having a precisely circular shape as the cross sectional shape thereof before weaving, are woven in a predetermined weaving manner and thus easily flattened in directions (X-axis and Y-axis directions) perpendicular to the Z-axis. The warp fibers 3a and the weft fibers 3b (screen gauze 3) woven in a predetermined weaving manner and flattened are stretched on the plate frame 2, and thus the warp fibers 3a and the weft fibers 3b flattened are not only elongated in the longitudinal direction, but also further flattened in the directions perpendicular to the Z-axis. Thus, the total thickness of each of the warp fibers 3a and each of the weft fibers 3b is decreased to 88% or less, and the thickness t of the screen gauze 3 stretched on the plate frame 2 is 88% or less based on the thickness of the screen gauze 3 under application of no tensile force. Thus, in the screen plate 1 of the present embodiment, the thickness t of the screen gauze 3 stretched on the plate frame 2 is decreased to 88% or less based on the thickness of the screen gauze 3 under application of no tensile force, and therefore the thickness t of the screen gauze 3 is easily smaller and a printing coating film having a small thickness (for example, a thin printing coating film having a thickness of 1 μm or less) is easily formed. A thickness t of the screen gauze 3 stretched on the plate frame 2, of more than 88%, based on the thickness of the screen gauze 3 under application of no tensile force reduces the tensile force to be applied to the screen gauze 3. Specifically, in the case of use of fibers to be easily elongated, such as fibers including a liquid crystal polymer, the thickness t of the screen gauze 3 is more than 88% based on the thickness of the screen gauze 3 under application of no tensile force, thereby reducing the tensile force to be applied to the screen gauze 3. Thus, a higher setting amount of clearance (distance between the screen gauze 3 and the substrate) to be set is needed for printing plate releasing. An increase in the setting amount of clearance to be set causes the screen gauze 3 to be largely deformed in screen printing, thereby causing a printing pattern to be hardly formed into a desired shape. Moreover, an increase in the setting amount of clearance to be set may cause a printing pattern to be hardly formed at a predetermined position on the substrate, and also cause a printing position to be easily displaced in repeated printing. The Young's modulus of the screen gauze 3 stretched on the plate frame 2 is preferably 2000 N/mm² or more from the viewpoint that the setting amount of clearance to be set, necessary for printing plate releasing, is reduced. Not only the thickness t of the screen gauze 3 stretched on the plate frame 2 is 88% or less based on the thickness of the screen gauze 3 under application of no tensile force, but also the Young's modulus of the screen gauze 3 stretched on the plate frame 2 is 2000 N/mm² or more, thereby enabling the setting amount of clearance to be set, necessary for plate releasing, to be reduced, and enabling printing accuracy to be more improved. A higher Young's modulus of the screen gauze 3 stretched on the plate frame 2 results in a need for use of fibers higher in Young's modulus, but such fibers are deteriorated in handleability, for example, breakage of a mesh is caused by slight ununiformity of the tensile force balance of the entire screen gauze 3 in plate making and/or gauze stretching. Thus, the Young's modulus is preferably 30000 N/mm² or less. Herein, the Young's modulus of the screen gauze 3 stretched on the plate frame 2 means the average of the Young's moduli in the lengthwise direction (Y direction) and the crosswise direction (X direction) of the screen gauze 3 stretched on the plate frame 2, and can be obtained by pulling the screen gauze 3 in both the lengthwise direction (Y direction) and the crosswise direction (X direction) with the tensile force applied by stretching on the plate frame 2 being applied to the screen gauze 3, and averaging the respective Young's moduli calculated from the tangent line at the initial point of the load-elongation curve acquired.

The thickness t of the screen gauze 3 stretched on the plate frame 2 is preferably 70% or more based on the thickness of the screen gauze 3 under application of no tensile force. A thickness t of the screen gauze 3 stretched on the plate frame 2, of less than 70%, based on the thickness of the screen gauze 3 under application of no tensile force generates a larger tensile force before stretching of the plate frame 2, easily resulting in cutting of fibers in application of such a tensile force and/or thinning and cutting of the warp fibers 3a and the weft fibers 3b in the screen gauze 3 stretched on the plate frame 2, thereby causing inferior printing durability in some cases.

As in a prior art such as a method for stretching a screen gauze 3 including warp fibers 3a and weft fibers 3b flattened by pressurizing, on a plate frame 2, such warp fibers 3a and such weft fibers 3b are not almost elongated in the longitudinal direction in the flattening, thereby causing such warp fibers 3a and such weft fibers 3b to be easily spread in the width direction. On the other hand, in the screen plate 1 of the present embodiment, the warp fibers 3a and the weft fibers 3b are elongated in the longitudinal direction in flattening of the warp fibers 3a and the weft fibers 3b, as described above. The cross sectional areas of the warp fibers 3a and the weft fibers 3b elongated in the longitudinal direction are smaller than the cross sectional areas of the warp fibers 3a and the weft fibers 3b not elongated in the longitudinal direction, thereby inhibiting the warp fibers $3a$ and the weft fibers $3b$ from extending in the width direction even if the warp fibers $3a$ and the weft fibers $3b$ are flattened. In other words, the warp fibers $3a$ and the weft fibers $3b$ can be elongated in the longitudinal direction in flattening of the warp fibers $3a$ and the weft fibers $3b$, thereby inhibiting the warp fibers $3a$ and the weft fibers $3b$ from extending in the width direction. Accordingly, the screen plate 1 of the present embodiment is unlikely to cause increases in the widths (d11, d21) of each of the warp fibers $3a$ and each of the weft fibers $3b$ and easily allows the opening portions $3c$ to be maintained (the opening ratio described below is hardly decreased) as compared with a conventional screen plate 1 where the thickness of a screen gauze 3 is adjusted by pressurizing or the like to the same thickness as the thickness t of the screen gauze 3 in the present embodiment. The opening portions $3c$ are maintained and thus the opening portions $3c$ are easily filled with a larger amount of ink, thereby allowing a larger amount of ink to be easily transferred to the substrate. In other words, the screen plate 1 of the present embodiment can allow ink to be easily spread uniformly on the substrate, thereby facilitating formation of a printing coating film having a uniform thickness, resulting in an improvement in printing accuracy. Herein, the width direction of the warp fibers $3a$ corresponds to the X-axis direction and the width direction of the weft fibers $3b$ corresponds to the Y-axis direction.

While an example of flattening of the warp fibers $3a$ and the weft fibers $3b$ by weaving is described in the present embodiment, the warp fibers $3a$ and the weft fibers $3b$ are not necessarily needed to be flattened by weaving (namely, the warp fibers $3a$ and the weft fibers $3b$ may have a precisely circular shape as the cross sectional shape thereof). In the case where the warp fibers $3a$ and the weft fibers $3b$ woven have a precisely circular shape as the cross sectional shape thereof, the screen gauze 3 is stretched on the plate frame 2 by a predetermined tensile force, to thereby elongate the warp fibers $3a$ and the weft fibers $3b$ in the longitudinal direction, resulting in decreases in the diameters of each of the warp fibers $3a$ and each of the weft fibers $3b$ with the cross sectional shapes of the warp fibers $3a$ and the weft fibers $3b$ being precisely circular shapes. The total thickness (diameter) of each of the warp fibers $3a$ and each of the weft fibers $3b$ is decreased to a thickness of 88% or less, and thus the thickness t of the screen gauze 3 stretched on the plate frame 2 is 88% or less based on the thickness of the screen gauze 3 under application of no tensile force. In other words, even in the case where the warp fibers $3a$ and the weft fibers $3b$ woven have a precisely circular shape as the cross sectional shape thereof, the screen plate 1 of the present embodiment easily has a smaller thickness t of the screen gauze 3 and allows for easy formation of a thinner printing coating film (for example, a thin printing coating film having a thickness of 1 μm or less). In the case where the warp fibers $3a$ and the weft fibers $3b$ are decreased in the diameters thereof by stretching of the screen gauze 3 on the plate frame 2 by a predetermined tensile force, the warp fibers $3a$ and the weft fibers $3b$ are also decreased in the widths (d11, d21) thereof, thereby enabling the opening ratio to be increased as compared with a conventional screen plate 1 where the thickness of a screen gauze 3 is adjusted by pressurizing or the like to the same thickness as the thickness t of the screen gauze 3 in the present embodiment. Accordingly, even in the case where the warp fibers $3a$ and the weft fibers $3b$ woven have a precisely circular shape as the cross sectional shape thereof, the screen plate 1 of the present embodiment can allow the opening portions $3c$ to be filled with a larger amount of ink, resulting in an improvement in printing accuracy.

The synthetic fiber constituting each of the warp fibers $3a$ and the synthetic fiber constituting each of the weft fibers $3b$ may be the same as or different from each other. The synthetic fiber constituting each of the warp fibers $3a$ and the synthetic fiber constituting each of the weft fibers $3b$ are preferably the same from the viewpoint that the screen gauze 3 can be easily woven and the warp fibers $3a$ and the weft fibers $3b$ in the screen gauze 3 can be suppressed in the variation in strength therebetween.

The synthetic fiber constituting each of the warp fibers $3a$ and the synthetic fiber constituting each of the weft fibers $3b$ may be monofilaments or multifilaments, or the synthetic fiber constituting each of the warp fibers $3a$ may be a multifilament and the synthetic fiber constituting each of the weft fibers $3b$ may be a monofilament, and conversely. Each of the warp fibers $3a$ and each of the weft fibers $3b$ are preferably made of a monofilament from the viewpoint of an improvement in printing accuracy (for example, clearness and resolution of a print) and durability of a printing coating film. In particular, in the case of printing of a thin printing coating film having a thickness of 1 or less, a monofilament is suitable. In the case of use of a multifilament, the diameters (shorter diameter d12 and longer diameter d11) of each of the warp fibers $3a$ and the diameters (shorter diameter d22 and longer diameter d21) of each of the weft fibers $3b$ are easily increased, thereby causing a thin printing coating film to be hardly made by printing. The synthetic fiber as a monofilament may be made of a single material or may be made of two or more materials different in properties from each other. A synthetic fiber made of two or more materials may be a core-sheath fiber where the material of the core portion of the cross section and the material of the sheath portion of the cross section are different, a blend fiber obtained by mixing two or more materials molten, a core-sheath fiber where a material obtained by mixing two or more materials molten is used for each material of a core portion and a sheath portion, or a sea-island fiber where materials are different between a plurality of island portions extending in the longitudinal direction of the fiber and a sea portion surrounding such island portions. Furthermore, a core-sheath composite fiber may also be adopted where an island portion and a sea portion are formed on a sheath portion and a core portion. The surface of the synthetic fiber may be coated or modified with an organic substance or an inorganic substance.

The weaving density of the screen gauze 3 is defined by the number of fibers (warp fibers $3a$, weft fibers $3b$) per inch of the screen gauze 3 (hereinafter, also referred to as "the number of meshes"). In the screen plate 1 of the present embodiment, the number of meshes in the warp fibers $3a$ and the number of meshes in the weft fibers $3b$ may be the same as or different from each other. The number of meshes in the warp fibers $3a$ and the number of meshes in the weft fibers $3b$ are preferably the same as each other from the viewpoint of suppression of the variation in strength between the warp fibers $3a$ and the weft fibers $3b$ in the screen gauze 3.

The fibers (warp fibers $3a$, weft fibers $3b$) for use in the screen gauze 3 are the same in terms of the diameters (shorter diameter and longer diameter) to result in increases in strengths (for example, fracture strength and tear strength) of the screen gauze 3 according to an increase in the number of meshes, but result in a reduction in opening ratio described below. Accordingly, the printing accuracy is easy to be reduced (for example, pattern lines aligned at a high density are hardly printed). On the other hand, a smaller number of meshes results in a higher opening ratio, but easily results in low strengths of the screen gauze 3. Thus, there is a preferable range of the number of meshes in the screen gauze 3. While a preferable range of the number of meshes cannot be generally defined because the range depends on the materials, strengths, diameters, and the like of the fibers, the respective numbers of meshes in the warp fibers 3a and the weft fibers 3b are preferably 180 meshes or more, particularly preferably 220 meshes or more, further preferably 300 meshes or more from the viewpoint of sufficient strengths so that breakage of fibers in a step of stretching the screen gauze 3 on the plate frame 2 and in a printing step can be sufficiently suppressed. The respective numbers of meshes in the warp fibers 3a and the weft fibers 3b are also preferably 420 meshes or less, preferably 350 meshes or less, particularly preferably 330 meshes or less from the viewpoint of an improvement in printing accuracy.

Herein, the opening ratio (%) means the proportion of the area of the opening portions 3c per predetermined area of the screen gauze 3 on the X-Y plane surface. The opening ratio can be calculated by use of the following expression (1). In the following expression (1), w1 represents an interval between adjacent warp fibers 3a, w2 represents an interval between adjacent weft fibers 3b, d11 represents the width of each of the warp fibers 3a, and d21 represents the width of each of the weft fibers 3b.

$$\text{Opening ratio (\%)} = (w1 \times w2) / \{(w1+d11) \times (w2+d21)\} \times 100 \quad (1)$$

It is preferable for manufacturing a screen gauze 3 having a smaller thickness t by weaving that the warp fibers 3a and the weft fibers 3b before weaving have a tensile strength of 10 cN/dtex or more measured by a test method according to JIS L 1013. Any tensile strength of the warp fibers 3a and the weft fibers 3b, which is less than the above value, causes breakage of fibers in weaving to frequently occur due to such an insufficient strength, thereby easily making weaving difficult and causing a smaller thickness t of the screen gauze 3 to be hardly obtained.

The tear strength of the screen gauze 3 can be 200 gf or more, and is preferably 300 gf or more, further preferably 400 gf or more. A tear strength of less than 200 gf can cause the screen gauze 3 to be broken depending on the method for stretching the screen gauze 3 on the plate frame 2. Accordingly, it is hard to obtain a screen plate 1 where the screen gauze 3 is stretched by a tensile force sufficient for proper plate releasing. Herein, the tear strength can be measured according to JIS L 1096.

The warp fibers 3a and the weft fibers 3b before weaving may each include a synthetic fiber having a precisely circular shape or an ellipsoidal shape as the cross sectional shape thereof. In the case where the warp fibers 3a and the weft fibers 3b before weaving each include a synthetic fiber having a precisely circular shape as the cross sectional shape thereof, the diameter of each of the warp fibers 3a and the diameter of each of the weft fibers 3b before weaving are preferably 45 μm or less, further preferably 40 μm or less, further preferably 35 μm or less, particularly preferably 33 μm or less in order that printing accuracy is improved and formation of a thin printing coating film is facilitated. The diameter of each of the warp fibers 3a and the diameter of each of the weft fibers 3b are 35 μm or less, particularly 33 μm or less, thereby allowing a thin printing coating film with an alignment having a width of 150 μm, particularly a width of 60 μm to be easily made certainly by printing.

The respective synthetic fibers constituting the warp fibers 3a and the weft fibers 3b are not particularly limited as long as such fibers can be elongated in the longitudinal direction in stretching of the screen gauze 3 on the plate frame 2 and can allow the thickness t of the screen gauze 3 to be 88% or less based on the thickness of the screen gauze 3 under application of no tensile force. For example, a synthetic fiber made of polyester such as polyethylene terephthalate (PET), polybutylene terephthalate (PBT), polyethylene naphthalate (PEN) or liquid crystal polyester, nylon, polyphenylsulfone (PPS), or polyether ether ketone (PEEK), or a synthetic fiber made of a combination of two or more thereof can be used. Among the above, a synthetic fiber made of nylon or polyester is preferably used. A synthetic fiber including a liquid crystal polymer such as liquid crystal polyester has stretching properties and is excellent in dimension stability. Thus, use of a synthetic fiber including a liquid crystal polymer for the warp fibers 3a and the weft fibers 3b allows the warp fibers 3a and the weft fibers 3b to be hardly deformed even in repeated screen printing. Accordingly, a synthetic fiber including a liquid crystal polymer is particularly preferable because it is suitable for printing of a precise printing pattern which is to be repeatedly performed. Herein, the liquid crystal polymer refers to a polymer exhibiting liquid crystallinity in the form of a melt or liquid.

As described above, the thickness t of the screen gauze 3 is effectively thin for formation of a thin printing coating film having a thickness of 1 μm or less. The thickness t of the screen gauze 3 is preferably 30 or less for formation of a thin printing coating film having a thickness of 1 μm or less. The thickness t of the screen gauze 3 is preferably 25 μm or less for formation of a thin printing coating film having a thickness of 0.5 μm or less. The thickness t of the screen gauze 3 is preferably 20 μm or less for formation of a thin printing coating film having a thickness of 0.3 μm or less. Herein, the lower limit of the thickness t of the screen gauze 3 is not particularly limited and can be 12 μm or more.

The opening ratio (%) of the screen gauze 3 is preferably within a certain range and is preferably 20% or more and 60% or less, in order that the thickness of a printing coating film is easily uniformed and the identity (reproducibility) of a printing coating film to be repeatedly formed is improved. An opening ratio of less than 20% easily results in a reduction in the amount of ink for filling per unit area of the screen gauze 3, and thus a reduction in the amount of ink to be transferred to the substrate. Thus, ink is hardly spread uniformly on the substrate, and a printing coating film having a uniform thickness is hardly formed. An opening ratio of more than 60% easily causes jaggy where an end (namely, a boundary section with a substrate) of a printing coating film is hardly smoothened and an end of a printing coating film is irregularly protruded. Moreover, an opening ratio of more than 60% easily causes the screen gauze 3 to be easily deformed in a printing step, and easily causes the problem of easy cracking of a shielding film formed on the screen gauze 3, described below. Furthermore, it is necessary for achieving a high opening ratio of more than 60% that the widths (d11, d21) and the respective numbers of meshes of the warp fibers 3a and the weft fibers 3b be decreased, easily resulting in decreases in the strengths of the screen gauze 3.

Figure 3:
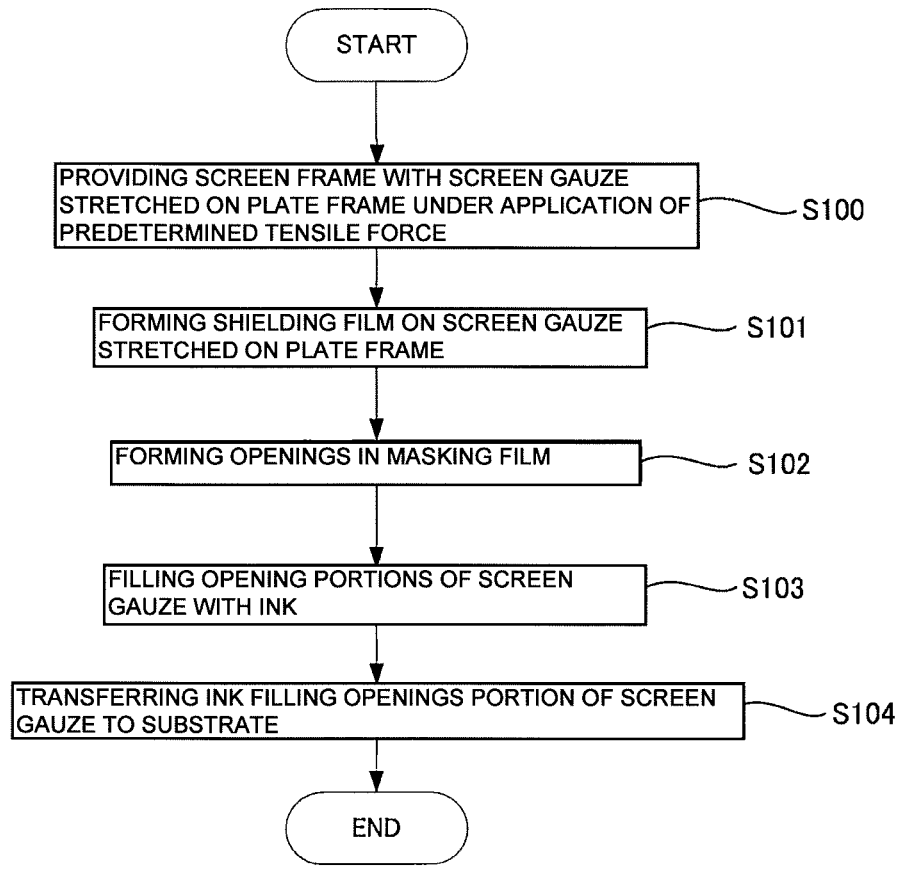
FIG. 3 is a flow chart describing the procedure of each treatment in screen printing.

Next, one example of the method for screen printing with the screen plate 1 of the present embodiment will be described with reference to FIG. 3 to FIG. 8. FIG. 3 is a flow chart describing the procedure of each treatment in screen printing with the screen plate 1 of the present embodiment. FIG. 4 to FIG. 8 are cross-sectional views of the screen plate 1 in such treatments.

Figure 4:
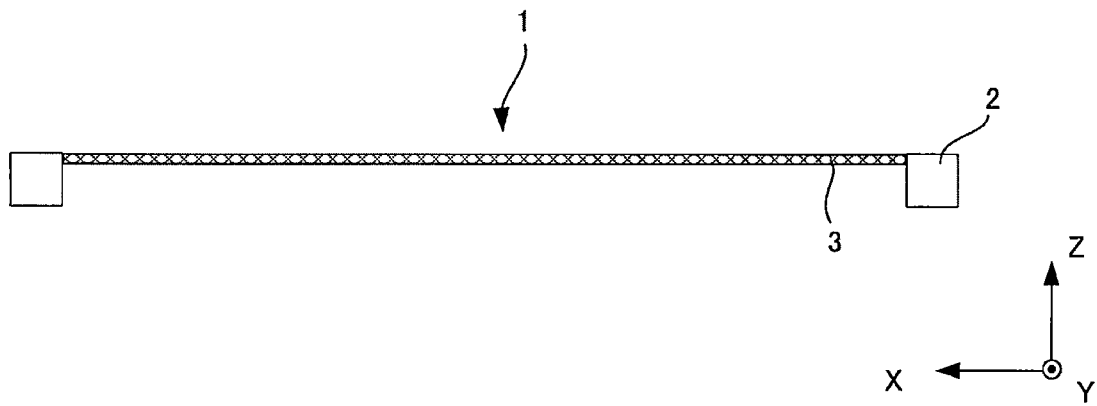
FIG. 4 is a cross-sectional view of the screen plate in a treatment (providing a screen plate) in screen printing.

In a treatment in step S100, a screen plate 1 is provided where a screen gauze 3 is stretched on a plate frame 2 under application of a predetermined tensile force, as illustrated in FIG. 4. The thickness t of the screen gauze 3 in the screen plate 1 is 88% or less based on the thickness of the screen gauze 3 under application of no tensile force.

Figure 5:
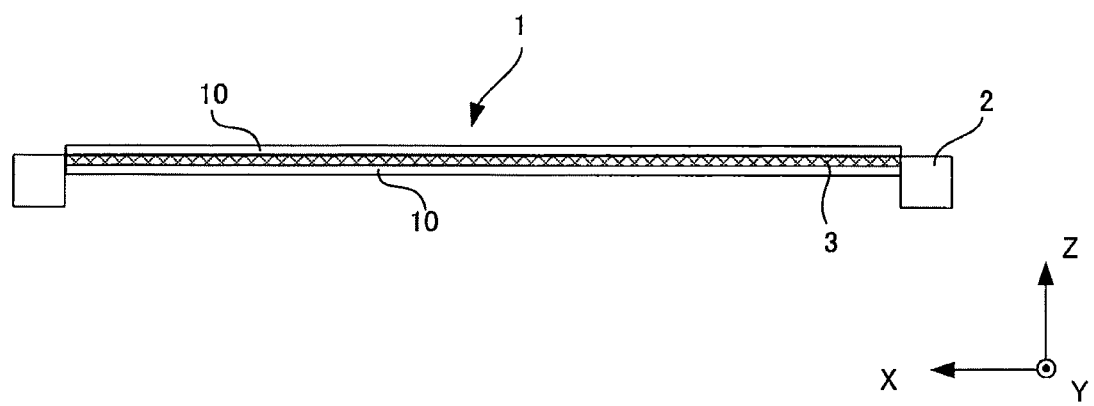
FIG. 5 is a cross-sectional view of the screen plate in a treatment (treatment for shielding film formation) in screen printing.

A treatment in step S101 forms a shielding film 10 on both surfaces (upper surface and lower surface) of the screen gauze 3, as illustrated in FIG. 5. For example, a photosensitive resin (photoresist) to be cured by irradiation with light can be used for the shielding film 10. The photosensitive resin that can be used is a diazo resin, a radical resin, a stilbazo resin, or the like, and the photosensitive resin that can be used is not limited by the curing mechanism. The photosensitive resin may be any one as long as it can form the shielding film 10, and the form of the shielding film 10 before formation is also not limited. For example, the photosensitive resin can be used in the form of a liquid or solid (film). A photosensitive resin in the form of a liquid can be used to thereby, for example, coating the screen gauze 3 with a photosensitive resin including a solvent, in the form of a liquid, and drying the resultant for evaporation/removal of the solvent, thereby forming the shielding film 10. The thickness of the shielding film 10 in the Z-axis direction can be adjusted by repeating coating and drying. Herein, while the shielding film 10 is provided on each of both surfaces of the screen gauze 3, including an upper surface to be brought into contact with a squeegee 13 described below and a lower surface to be brought into contact with a substrate 14 described below, but may be provided on only the lower surface. The shielding film is preferably provided on each of both such surfaces including the upper surface and the lower surface from the viewpoints of an enhancement in adhesiveness of the shielding film 10 to the screen gauze 3 and an enhancement in durability of the shielding film 10.

Figure 6A:
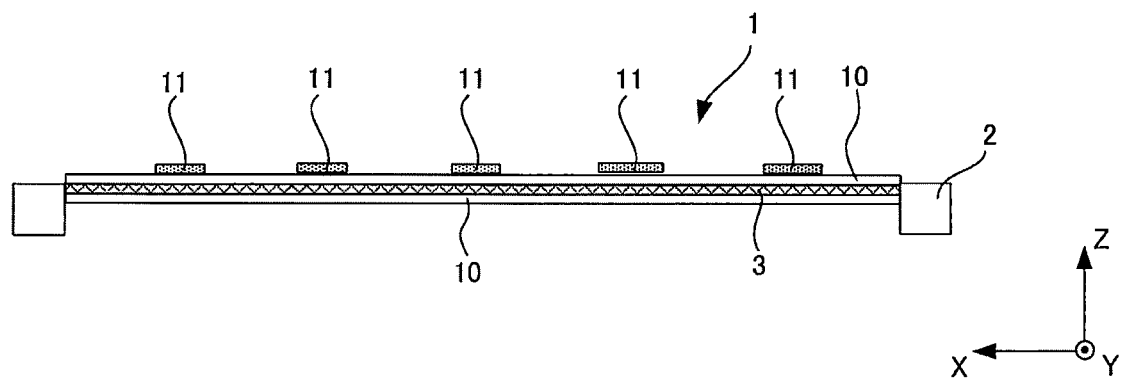
FIG. 6A is a cross-sectional view of the screen plate in a treatment (treatment for mask attachment) in screen printing.
Figure 6B:
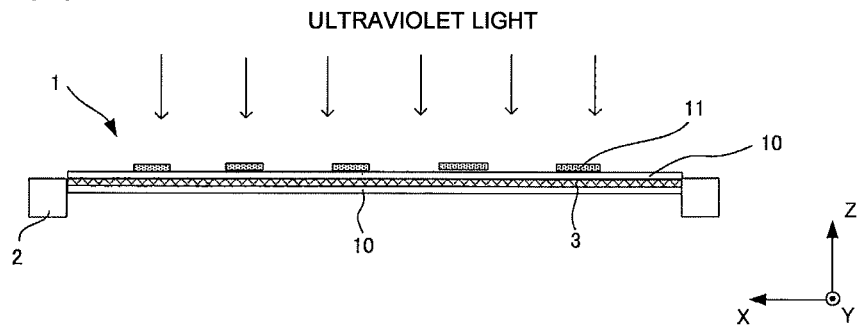
FIG. 6B is a cross-sectional view of the screen plate in a treatment (treatment for irradiation with ultraviolet light) in screen printing.
Figure 6C:
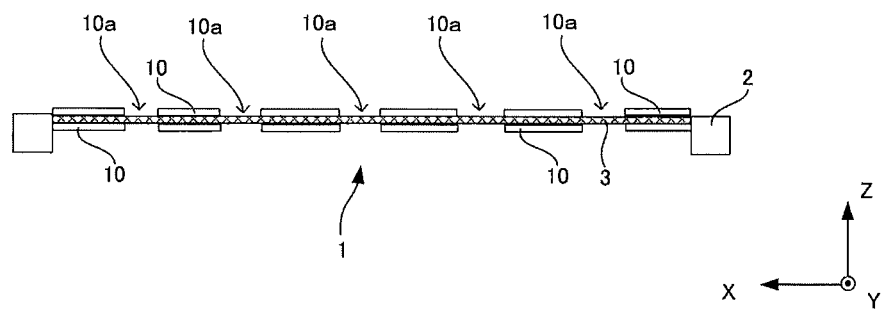
FIG. 6C is a cross-sectional view of the screen plate in a treatment (treatment for opening formation) in screen printing.

A treatment in step S102 forms openings 10a at locations corresponding to a desired printing pattern on the shielding film 10 to be formed on a surface of the screen gauze 3, as illustrated in FIG. 6A to FIG. 6C. Specifically, first, a mask 11 having a shape corresponding to a desired printing pattern is attached to the upper surface of the shielding film 10, as illustrated in FIG. 6A. The mask 11 usable is a film or glass. Next, the shielding film 10 where the mask 11 is attached is irradiated with ultraviolet light from above the screen gauze 1, as illustrated in FIG. 6B. Furthermore, the shielding film 10 irradiated with ultraviolet light is subjected to development to thereby allow the mask 11 and a region of the shielding film 10, covered with the mask 11, to be removed, as illustrated in FIG. 6C. Such a treatment forms openings 10a at locations corresponding to a desired printing pattern on the shielding film 10.

While the treatment in step S102 forms such openings 10a by removal of the region of the shielding film 10, covered with the mask 11, it can form openings 10a by changing the type of the shielding film 10 and/or the type of a developer to thereby leave the region of the shielding film 10, covered with the mask 11, and remove a region of the shielding film 10, not covered with the mask 11. In addition, while the treatment in step S102 attaches the mask 11 to the upper surface of the shielding film 10, it may attach the mask 11 to the lower surface of the shielding film 10. In the case where the mask 11 is attached to the lower surface of the shielding film 10, the shielding film 10 where the mask 11 is attached can be irradiated with ultraviolet light from below the screen gauze 1.

Figure 7:
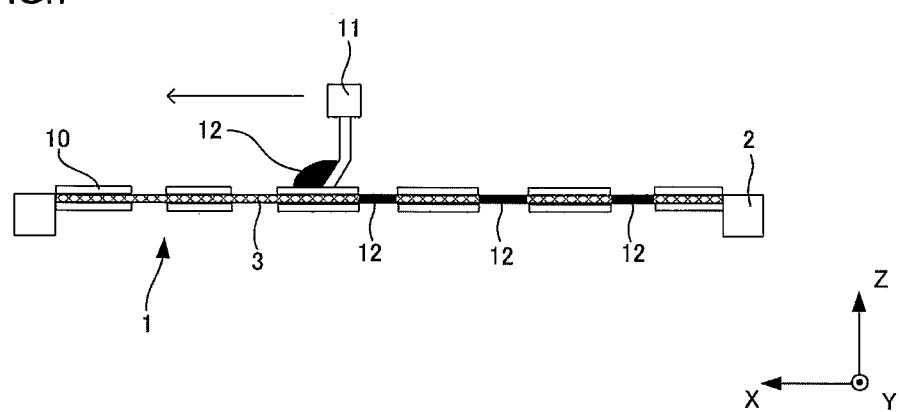
FIG. 7 is a cross-sectional view of the screen plate in a treatment (treatment for filling with ink) in screen printing.

A treatment in step S103 moves ink 12 on the shielding film 10 with a scraper 11 to fill the screen gauze 3 (each opening portion 3c) with the ink 12 through each of the openings 10a, as illustrated in FIG. 7. Such a treatment allows only each location of the screen gauze 3, corresponding to a desired printing pattern, to be filled with the ink 12.

Figure 8:
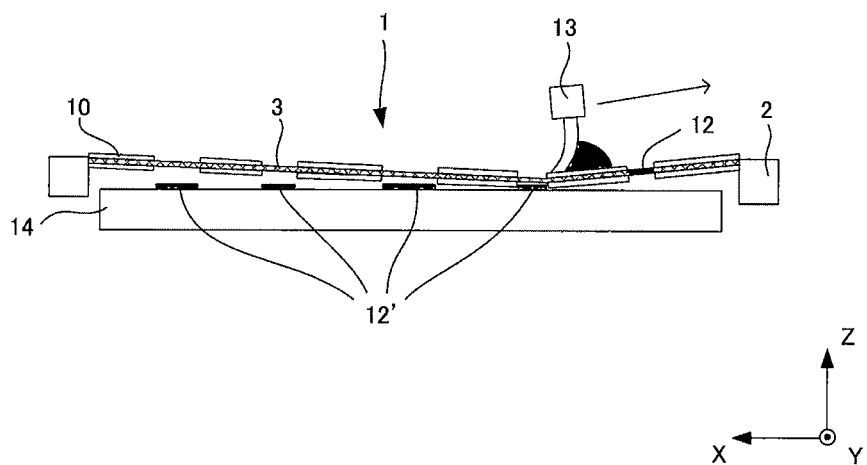
FIG. 8 is a cross-sectional view of the screen plate in a treatment (treatment for transferring) in screen printing.

A treatment in step S104 moves the squeegee 13 being pushed to the screen gauze 3 so that the screen gauze 3 filled with the ink 12 is brought into contact with a substrate 14, as illustrated in FIG. 8. Such a treatment allows the ink 12 filling the screen gauze 3 to be transferred to the substrate 14. The transferring of the ink 12 to the substrate 14 is performed by the occurrence of so-called plate releasing that is separation of the screen gauze 3 being pushed to the substrate 14, from the substrate 14.

The ink 12 transferred by the treatment in step S104 is used to print a desired printing pattern 12' onto the substrate 14. Herein, the printing pattern 12' refers to a design (including a graphic, a character, a line, and the like) formed by a printing coating film.

The thickness of the shielding film 10 in the Z-axis direction is preferably smaller from the viewpoint that formation of a thin printing coating film is facilitated, and can be determined in consideration of the ability to stably form the shielding film 10, the ability to maintain durability of the shielding film 10, the ability to maintain sealing properties for control of extension of the ink 12 filling the opening portions 3c of the screen gauze 3, and the like. A shielding film 10 having a small thickness is low in strength, and thus a region of the shielding film 10, not covered with the mask 11, can also be removed in removal of the shielding film 10 due to spraying of water or blowing of air in formation of the openings 10a. The thickness of the shielding film 10 is preferably large in order to inhibit the printing pattern 12' from being blured.

The thickness of the shielding film 10 is preferably 1 µm or more and 10 µm or less, more preferably 2 µm or more and 7 µm or less, further preferably 3 µm or more and 5 µm or less from the above viewpoints. The thickness of the shielding film 10 here means a thickness to be added to the thickness t of the screen gauze 3. In other word, the thickness of the shielding film 10 means a thickness obtained by subtracting the thickness t of only the screen gauze 3 from the thickness of the screen gauze 3 including the shielding film 10. The thickness of the shielding film 10 to be formed on the upper surface of the screen gauze 3 can be, for example, 0 to 2 µm.

The shielding film 10 can contain, as a part of the material constituting the shielding film 10, a component having water repellency/oil repellency for the purposes of preventing the substance (for example, photosensitive resin) constituting the shielding film 10 from being eluted to an organic solvent included in the ink 12 and also inhibiting the printing pattern 12' from being blured for an improvement in printing accuracy. Such a shielding film 10 may be a mono-layered shielding film 10 containing a component having water repellency/oil repellency, or may be a multi-layered shielding film 10 where a layer containing a component having water repellency/oil repellency and a layer containing no component having water repellency/oil repellency are laminated. A shielding film 10 may also be adopted where the surface of a layer containing no component having water repellency/oil repellency is coated with a component having water repellency/oil repellency (polymer or the like). While only a surface of the shielding film 10, to be disposed on the lower surface of the screen gauze 3, may be coated with a component having water repellency/oil repellency for the purpose of improving printing accuracy, respective surfaces of the shielding film 10, to be disposed on both the lower surface and the upper surface of the screen gauze 3, are preferably coated with such a component for the purpose of inhibiting the substance constituting the shielding film 10 (for example, resin) from being eluted to an organic solvent included in the ink 12.

Examples of the component having water repellency/oil repellency include a substance including fluorine and/or silicon. For example, a resin, oligomer, oil, or monomer including fluorine or silicon can be blended with a raw material (photosensitive resin) of the shielding film 10, or the surface(s) of the shielding film 10 can be coated with such a substance, thereby allowing water repellency/oil repellency to be imparted.

Furthermore, in the case where the ink 12 contains an organic solvent, the shielding film 10 can be treated with a chemical agent and/or the shielding film 10 after formation of the printing pattern 12' can be additionally irradiated with ultraviolet light to result in an enhancement in the density of crosslinking of the shielding film 10, in order to inhibit the substance (for example, resin) constituting the shielding film 10 from being eluted into the organic solvent and/or inhibit the shielding film 10 from being swollen. Such treatments can be performed to result in enhancements in stability and durability of the shielding film 10 in printing.

Next, a method for manufacturing the screen plate 1 of the present embodiment will be described.

The screen plate 1 of the present embodiment can be manufactured by weaving the warp fibers 3a and the weft fibers 3b to form the screen gauze 3, and stretching the resulting screen gauze 3 on the plate frame 2 under application of a predetermined tensile force, thereby allowing the thickness of the screen gauze stretched on the plate frame 2 to be a thickness of 88% or less based on the thickness of the screen gauze under application of no tensile force. The warp fibers 3a and the weft fibers 3b for use in weaving can be each any synthetic fiber having a precisely circular shape as the cross sectional shape thereof, and are woven and thus easily flattened in directions perpendicular to the Z-axis.

A gauze stretching machine can be used for stretching the screen gauze 3 on the plate frame 2. Specifically, the screen gauze 3 is sandwiched at respective sites on four sides thereof by clamps of the gauze stretching machine, and the clamps are pulled by use of mechanical and air pressures, and modulated to a predetermined tensile force and predetermined bias angles, to secure the screen gauze 3 to the plate frame 2 under application of such a predetermined tensile force. Thereafter, the screen gauze 3 is cut along with the outer circumference of the plate frame 2. The predetermined tensile force to be applied to the screen gauze 3 may be any tensile force so that the thickness t of the screen gauze 3 stretched on the plate frame 2 is 88% or less based on the thickness of the screen gauze 3 under application of no tensile force (the screen gauze 3 before stretching on the plate frame 2) in consideration of elongation properties of the warp fibers 3a and the weft fibers 3b. For example, the predetermined tensile force to be applied to the screen gauze 3 can be within the range from 21 N/cm to 36 N/cm. In the case where a high printing accuracy is required, the tensile force is more preferably within the range from 25 N/cm to 36 N/cm. Herein, the bias angle refers to any sharp angle among angles between the warp fibers 3a or the weft fibers 3b and the plate frame 2.

An adhesive can be used as an agent for securing the screen gauze 3 to the plate frame 2. Examples of the adhesive may include rubber, epoxy-based, urethane-based, and cyanoacrylate-based adhesives, and such an adhesive is not particularly limited in the present embodiment and may be selected in consideration of the material of the screen gauze 3 and the material of the plate frame 2, as well as the solvent contained in ink to be used.

The predetermined tensile force to be applied to the screen gauze 3 is an important factor for the above plate releasing. A smaller tensile force causes the plate releasing not to be properly performed, resulting in ununiform transferring of ink, to easily result in a decrease in printing accuracy, for example, the variation in the thickness of a printing coating film. The tensile force for properly performing the plate releasing is needed to be 21 N/cm or more per unit width of the screen gauze 3, and the fracture strength of the screen gauze 3 is thus preferably 40 N/cm or more so that neither breakage of the fibers nor breakage of the screen gauze 3 is caused in a step of stretching the screen gauze 3 on the plate frame 2 and in each step of printing. Herein, the fracture strength can be measured according to JIS L1096.

As described above, the screen plate 1 of the present embodiment has a thickness t of the screen gauze 3 stretched on the plate frame 2, of 88% or less, based on the thickness of the screen gauze 3 under application of no tensile force (the screen gauze 3 before stretching on the plate frame 2). That is, the screen gauze 3 is stretched on the plate frame 2 and subjected to a predetermined tensile force, thereby allowing the warp fibers 3a and the weft fibers 3b to be elongated, to result in a decrease in the total thickness (d12+d22) of such fibers to 88% or less based on the total thickness of each of the warp fibers 3a and each of the weft fibers 3b under application of no tensile force. The screen plate 1 of the present embodiment, which has such a configuration, is easily decreased in the thickness t of the screen gauze 3, and allows for easy formation of a thin printing coating film (for example, a thin printing coating film having a thickness of 1 μm or less).

The warp fibers 3a and the weft fibers 3b are not only decreased in the thicknesses (d12, d22), but also elongated in the longitudinal direction, in stretching of the screen gauze 3 on the plate frame 2 at a predetermined tensile force, and thus the warp fibers 3a and the weft fibers 3b are inhibited from extending in the width direction. Accordingly, the opening ratio is hardly decreased and the opening portions 3c can be filled with a large amount of the ink 12 as compared with a screen plate 1 where the warp fibers 3a and the weft fibers 3b are flattened to adjust the thickness of the screen gauze 3 to the same as the thickness t of the screen gauze 3 in the present embodiment by pressurizing or the like. In other words, the screen plate 1 of the present embodiment can allow for easy formation of a printing coating film having a uniform thickness and can allow printing accuracy to be improved.

The screen plate 1 of the present embodiment can inhibit the warp fibers 3a and the weft fibers 3b from extending in the width direction, as described above, and thus can be easily maintained in terms of the opening ratio and can be suppressed in a reduction in printing accuracy even in increases in the respective numbers of meshes in the warp fibers 3a and the weft fibers 3b. In other words, the screen plate 1 of the present embodiment can allow enhancements in strengths (for example, fracture strength and tear strength) of the screen gauze 3 and an improvement in printing accuracy to be simultaneously satisfied.

Furthermore, the screen plate 1 of the present embodiment can allow a thin printing coating film having a thickness of 1 μm or less to be formed by modulation of the thickness t of the screen gauze 3. Accordingly, a thin printing coating film can be formed even by no reduction in the concentration of a solid in ink, and a reduction in printing accuracy caused by a reduction in the concentration of the solid and the variation in the thickness of a printing coating film caused by the change in the concentration of the solid can also be suppressed.

The screen plate 1 of the present embodiment can be easily decreased in the thicknesses (d12, d22) of each of the warp fibers 3a and each of the weft fibers 3b as compared with a screen plate 1 that is changed in the thickness of the screen gauze 3 to at most more than 88% by application of a predetermined tensile force. Thus, the screen plate 1 of the present embodiment, of these screen plates 1 having the same thickness t of the screen gauze 3, can allow thicker fibers to be used as the warp fibers 3a and the weft fibers 3b before application of a tensile force. In other words, the screen plate 1 of the present embodiment is easily enhanced in the strengths (for example, fracture strength and tear strength) of the screen gauze 3 by application of a predetermined tensile force, as compared with the screen plate 1 that that is changed in the thickness of the screen gauze to at most more than 88%.

One method here considered for a reduction in the thickness t of the screen gauze 3 stretched on the screen plate 1 is to produce the screen plate 1 by weaving warp fibers 3a and weft fibers 3b small in thickness to produce a screen gauze 3 and stretching the resulting screen gauze 3 on the plate frame 2 without any reduction in the thicknesses of the warp fibers 3a and the weft fibers 3b. The warp fibers 3a and the weft fibers 3b, however, are more easily broken according to decreases in diameters, and thus warp fibers 3a and weft fibers 3b small in thicknesses (d12, d22) are easily broken in weaving and cannot withstand repeated printing. Accordingly, such a production method can merely allow the thicknesses (d12, d22) of each of the warp fibers 3a and each of the weft fibers 3b stretched on the plate frame 2 to be predetermined thicknesses or more which is unlikely to cause breakage of fibers, and has the problem of having difficulty in decreasing the thickness t of the screen gauze 3.

On the other hand, the method for manufacturing the screen plate 1 according to the present embodiment allows the thicknesses of the warp fibers 3a and the weft fibers 3b to be decreased in stretching of the warp fibers 3a and the weft fibers 3b (screen gauze 3) woven, on the plate frame 2, resulting in a decrease in the thickness of the screen gauze 3. Thus, the thicknesses (d12, d22) of each of the warp fibers 3a and each of the weft fibers 3b stretched on the plate frame 2 can be smaller than a predetermined thickness which is unlikely to cause breakage of fibers. Accordingly, the method for manufacturing the screen plate 1 according to the present embodiment easily decreases the thickness t of the screen gauze 3 and easily forms a thin printing coating film (for example, a thin printing coating film having a thickness of 1 μm or less), as compared with the above production method.

Next, a modified example of the screen plate 1 of the present embodiment will be described. In the present modified example, the warp fibers 3a and the weft fibers 3b are elongated in the longitudinal direction by stretching the plate frame 2 with the screen gauze 3 being warmed, resulting in a decrease in the total thickness (d12+d22) of each of the warp fibers 3a and each of the weft fibers 3b to a thickness of 88% or less. In other words, a screen plate 1 of the present modified example can be produced by weaving the warp fibers 3a and the weft fibers 3b to form the screen gauze 3, warming the screen gauze 3 and applying a predetermined tensile force to the screen gauze 3, and stretching the screen gauze 3 on the plate frame 2 under application of a predetermined tensile force.

While the warming temperature of the screen gauze 3 cannot be generally determined because it depends on the materials of the fibers, the diameters of the fibers, the predetermined tensile force to be applied to the screen gauze 3, and the like, it can be, for example, 180° C. or less.

The warp fibers 3a and the weft fibers 3b that can be used in the present modified example are not particularly limited as long as these fibers can be each a synthetic fiber that can be elongated in the longitudinal direction in stretching of the screen gauze 3 warmed, on the plate frame 2, to allow the thickness t of the screen gauze 3 to be 88% or less based on the thickness of the screen gauze 3 under application of no tensile force. For example, a synthetic fiber made of polyester such as polyethylene terephthalate (PET), polybutylene terephthalate (PBT), polyethylene naphthalate (PEN) or a liquid crystal polyester, nylon, polyphenylsulfone (PPS), or polyether ether ketone (PEEK), or a synthetic fiber as a combination of two or more thereof can be used.

The screen plate 1 of the present modified example exerts the same effect as that of the screen plate 1 of the present embodiment. Specifically, the screen plate 1 of the present modified example can have a thickness t of the screen gauze 3 stretched on the plate frame 2, of 88% or less, based on the thickness of the screen gauze 3 under application of no tensile force, and can be easily decreased in the thickness t of the screen gauze 3, resulting in easy formation of a thin printing coating film (for example, a thin printing coating film having a thickness of 1 μm or less). The screen plate 1 of the present modified example not only provides decreased thicknesses (d12, d22), but also is elongated in the longitudinal direction, in stretching of the screen gauze 3 on the plate frame 2, thereby inhibiting the warp fibers 3a and the weft fibers 3b from extending in the width direction. Accordingly, the opening portions 3c can be easily filled with the ink 12, resulting in an improvement in printing accuracy. A method for manufacturing the screen plate 1 of the present modified example has the same effect as that of the method for manufacturing the screen plate 1 of the present embodiment. Specifically, the method for manufacturing the screen plate 1 of the present modified example includes decreasing the thicknesses of the warp fibers 3a and the weft fibers 3b to decrease the thickness of the screen gauze 3 in stretching of the warp fibers 3a and the weft fibers 3b (screen gauze 3) woven, on the plate frame 2, and thus the thicknesses (d12, d22) of each of the warp fibers 3a and each of the weft fibers 3b stretched on the plate frame 2 can be smaller than a predetermined thickness which is unlikely to cause breakage of fibers. Accordingly, a screen plate 1 having a screen gauze 3 having a small thickness t is easily produced. Herein, the screen gauze 3 is stretched on the plate frame 2 with being warmed, easily causing the warp fibers 3a and the weft fibers 3b to be plastically deformed, and thus the screen gauze 3 is preferably stretched on the plate frame 2 without being warmed, from the viewpoint that improved printing accuracy is maintained.

EXAMPLES

Next, the present invention will be more specifically described with reference to Examples, but the present invention is not intended to be limited to only these Examples.

Example 1

A core-sheath composite fiber (product name: Vecry manufactured by Kuraray Co., Ltd.) was provided as a synthetic fiber monofilament, the core-sheath composite fiber consisting of a core portion made of polyarylate (liquid crystal polyester) and a sheath portion made of a thermoplastic polymer as a component of a sea portion and polyarylate (liquid crystal polyester) as a component of an island portion. The core-sheath composite fiber had a precisely circular shape as the cross sectional shape thereof and had a diameter of 23 µm. The core-sheath composite fiber was used for warp fibers 3a and weft fibers 3b, and the warp fibers 3a and the weft fibers 3b were woven in a plain weave manner so that both the fibers had a density of 380 meshes, thereby providing a screen gauze 3 (hereinafter, also referred to as "raw fabric").

The screen gauze 3 (raw fabric) produced was sandwiched at respective sites on four sides thereof by clamps of a gauze stretching machine, and the screen gauze 3 was stretched on a plate frame 2 made of aluminum, having a size of 320 mm×320 mm, under application of a tensile force of 36 N/cm, thereby providing screen plate 1 of Example 1. The bias angle between each of the warp fibers 3a and each of the weft fibers 3b in the screen plate 1 of Example 1 was 22.5 degrees.

Example 2

A nylon fiber was provided as a synthetic fiber monofilament. The fiber had a precisely circular shape as the cross sectional shape thereof and had a diameter of 30 The fiber was used for warp fibers 3a and weft fibers 3b, and the warp fibers 3a and the weft fibers 3b were woven in a plain weave manner so that both the fibers had a density of 305 meshes, thereby providing a screen gauze 3 (hereinafter, also referred to as "raw fabric").

The screen gauze 3 (raw fabric) produced was sandwiched at respective sites on four sides thereof by clamps of a gauze stretching machine, and the screen gauze 3 was stretched on a plate frame 2 made of aluminum, having a size of 320 mm×320 mm, under application of a tensile force of 21 N/cm, thereby providing a screen plate 1 of Example 2. The bias angle between each of the warp fibers 3a and each of the weft fibers 3b in the screen plate 1 of Example 2 was 22.5 degrees.

Example 3

As in Example 1, a core-sheath composite fiber (product name: Vecry manufactured by Kuraray Co., Ltd.) was provided as a synthetic fiber monofilament, the core-sheath composite fiber including a core portion made of polyarylate (liquid crystal polyester) and a sheath portion made of a thermoplastic polymer as a component of a sea portion and polyarylate (liquid crystal polyester) as a component of an island portion. The core-sheath composite fiber had a precisely circular shape as the cross sectional shape thereof and had a diameter of 23 µm. The core-sheath composite fiber was used for warp fibers 3a and weft fibers 3b, and the warp fibers 3a and the weft fibers 3b were woven in a plain weave manner so that both the fibers had a density of 330 meshes, thereby providing a screen gauze 3 (hereinafter, also referred to as "raw fabric").

The screen gauze 3 (raw fabric) produced was sandwiched at respective sites on four sides thereof by clamps of a gauze stretching machine, and the screen gauze 3 was stretched on a plate frame 2 made of aluminum, having a size of 320 mm×320 mm, under application of a tensile force of 36 N/cm, thereby providing a screen plate 1 of Example 3. The bias angle between each of the warp fibers 3a and each of the weft fibers 3b in the screen plate 1 of Example 3 was 22.5 degrees.

Comparative Example 1

The screen gauze 3 (raw fabric) obtained by weaving in Example 1 was allowed to pass between two metallic rolls set to conditions of 120° C. and 300 N/cm, thereby providing a screen gauze 3 pressurized and heated (hereinafter, also referred to as "raw fabric pressurized and heated"). The same manner was performed as in Example 1 except that the screen gauze 3 pressurized and heated was stretched on the plate frame 2, thereby providing a screen plate 1 of Comparative Example 1.

The screen plate 1 of each Example was subjected to measurements of the thickness of the raw fabric and that of the screen gauze 3 stretched on the plate frame 2 (hereinafter, also referred to as "gauze thickness"), and also the opening ratio was determined. In addition, the ratio of the gauze thickness of the screen gauze 3 stretched on the plate frame 2 to the gauze thickness of the raw fabric (hereinafter, also referred to as "the ratio of gauze thickness") (%) was determined. The results are shown in Table 1 described below.

The screen plate 1 of Comparative Example was subjected to measurements of the gauze thicknesses of the raw fabric, the raw fabric pressurized and heated, and the screen gauze 3 stretched on the plate frame 2, and also the opening ratio was determined. Furthermore, the ratio of the gauze thickness of the screen gauze 3 stretched on the plate frame 2 to the gauze thickness of the raw fabric pressurized and heated (hereinafter, also referred to as "the ratio of gauze thickness") (%) was determined. The results are shown in Table 1 described below.

Herein, the gauze thickness was measured with a thickness meter (MG-4 Model manufactured by Protec Eng Co., Ltd.). The opening ratio was determined according to the above expression (1) by actually measuring the widths (d11, d21) of each of the warp fibers 3a and each of the weft fibers 3b, the interval w1 between adjacent warp fibers 3a and the interval w2 between adjacent weft fibers 3b with a length measuring machine (DR-55-F Model manufactured by Dainippon Screen Mfg. Co., Ltd.).

TABLE 1

| | Raw fabric | | Raw fabric pressurized and heated | | Screen gauze stretched on plate frame | | Ratio of |
|---|---|---|---|---|---|---|---|
| | Gauze thickness (μm) | Opening ratio (%) | Gauze thickness (μm) | Opening ratio (%) | Gauze thickness (μm) | Opening ratio (%) | gauze thickness (%) |
| Example 1 | 43 | 31 | — | — | 36 | 31 | 84% |
| Example 2 | 50 | 41 | — | — | 44 | 38 | 88% |
| Example 3 | 42 | 38 | — | — | 36 | 37 | 86% |
| Comparative Example 1 | 43 | 31 | 36 | 25 | 36 | 25 | 100% |

The screen gauze 3 of each screen plate 1 of Examples and Comparative Example was coated with a photosensitive resin (product name: AX-81 manufactured by Oji Tac Co., Ltd.) by use of a scoop, and the photosensitive resin subjected to coating was dried. The coating with the photosensitive resin and the drying of the resultant were repeated, thereby forming a shielding film 10 having a thickness of about 5 μm. A mask 11 having a size of 40 mm×40 mm was attached to the shielding film 10, and subjected to exposure and development, thereby forming openings 10a each having a size of 40 mm×40 mm on the shielding film 10.

As understood from Table 1, the screen plate 1 of each of Examples had an opening ratio of 31% or more. On the other hand, the screen plate 1 of Comparative Example had an opening ratio of 25%. It was found from the results that the screen plate 1 of each of Examples allowed the opening portions 3c to be filled with a large amount of the ink 12 as compared with the screen plate of Comparative Example and thus allowed for easy formation of a printing coating film having a uniform thickness and allow printing accuracy to be improved.

Example 4

The screen gauze 3 used in Example 1 was sandwiched at respective sites on four sides thereof by clamps of a gauze stretching machine, and stretched on a plate frame 2 made of aluminum, having a size of 320 mm×320 mm, under application of a tensile force of 36 N/cm, thereby providing a screen plate 1. The screen gauze 3 of the resulting screen plate 1 was coated with a photosensitive resin (product name: AX-81 manufactured by Oji Tac Co., Ltd.) by use of a scoop, and the photosensitive resin subjected to coating was dried. The coating with the photosensitive resin and the drying of the resultant were repeated, thereby forming a shielding film 10 having a thickness of about 5 μm. A mask 11 having a size of 120 mm×120 mm was attached to the shielding film 10, and subjected to exposure and development, thereby forming openings 10a each having a size of 120 mm×120 mm on the shielding film 10, to provide a screen plate 1 of Example 4.

Comparative Example 2

The same method as in Example 4 was performed except that the screen gauze 3 used in Example 4 was stretched on an aluminum plate frame 2 having a size of 320 mm×320 mm under application of a tensile force of 20 N/cm, thereby providing a screen plate 1 of Comparative Example 2.

(Printing Accuracy)

Each screen plate 1 of Example 4 and Comparative Example 2 was used to perform printing, and thus the printing accuracy was evaluated. A printing pattern having a size of 120 mm×120 mm was evaluated, and a case where the printing pattern on the 100th sheet had a size falling within 120 mm±30 μm×120±30 μm was rated as "Good" printing accuracy and a case where such a printing pattern had a size not falling within 120 mm±30 μm×120±30 μm was rated as "Poor" printing accuracy. Herein, the clearance (distance between the screen gauze 3 and the substrate) was defined as the minimum value at which plate releasing was made, and such a value was 0.7 mm in Example 4 and 1.8 mm in Comparative Example 2.

Table 2 represents the measurement results of the gauze thicknesses and the printing accuracy, as well as the Young's moduli calculated, in Example 4 and Comparative Example 2. Herein, the Young's modulus was obtained by pulling the screen gauze 3 in both the lengthwise direction (Y direction) and the crosswise direction (X direction) at a rate of pulling of 100 ram/min and at a distance between chucks of 200 mm with the tensile force applied by stretching on the plate frame 2 being applied to the screen gauze 3, and averaging the respective Young's moduli calculated from the tangent to the rise of the load-elongation curve acquired.

TABLE 2

| | Raw fabric Gauze thickness (μm) | Screen gauze stretched on plate frame Gauze thickness (μm) | Ratio of gauze thickness (%) | Printing accuracy | Young's modulus (N/mm²) |
|---|---|---|---|---|---|
| Example 4 | 43 | 36 | 84% | Good | 2525 |
| Comparative Example 2 | 43 | 39 | 91% | Poor | 1786 |

As understood from Table 2, the screen plate 1 according to the Example was rated as "Good" in the evaluation result of printing accuracy, and the screen plate 1 according to the Comparative Example was rated as "Poor" in the evaluation result of printing accuracy. It was found from the results that the screen plate 1 according to the Example allowed printing accuracy to be improved.

The invention claimed is:

1. A screen plate comprising
a plate frame, and
a screen gauze formed of warp and weft fibers woven in a predetermined weaving texture, wherein
the screen gauze is stretched on the plate frame under application of a predetermined tensile force,
the warp and the weft fibers are elongated by the predetermined tensile force applied to the screen gauze,
a thickness of the screen gauze stretched on the plate frame is reduced to 88% or less of a thickness of the screen gauze under application of no tensile force due to an elongation of the warp and the weft fibers, a diameter of each of the warp and the weft fibers before weaving is 33 μm or less, each of the warp and the weft fibers is made of a liquid crystal polymer, and the predetermined tensile force is 21 N/cm to 36 N/cm.

2. The screen plate according to claim 1, wherein the thickness of the screen gauze stretched on the plate frame is reduced to 70% or more of the thickness of the screen gauze under application of no tensile force.

3. The screen plate according to claim 1, wherein the warp and weft fibers are monofilaments.

4. A method for manufacturing a screen plate, comprising applying a predetermined tensile force to a screen gauze formed of warp and weft fibers woven in a predetermined weaving texture to elongate the warp and the weft fibers by the predetermined tensile force applied to the screen gauze and stretch the screen gauze on a plate frame, and allowing a thickness of the screen gauze stretched on the plate frame to be reduced to 88% or less of a thickness of the screen gauze under application of no tensile force due to an elongation of the warp and the weft fibers, wherein a diameter of each of the warp and the weft fibers before weaving is 33 μm or less, each of the warp and the weft fibers is made of a liquid crystal polymer, and the predetermined tensile force is 21 N/cm to 36 N/cm.

\* \* \* \* \*